United States Patent [19]
Sakaki et al.

[11] Patent Number: 5,860,818
[45] Date of Patent: Jan. 19, 1999

[54] ELECTRICAL CONNECTING MEMBER

[75] Inventors: Takashi Sakaki, Tokyo; Tetsuo Yoshizawa, Yokohama; Toyohide Miyazaki, Ibaraki; Hiroshi Kondo, Yokohama; Yoshimi Terayama, Odawara; Yuichi Ikegami, Osaka; Takahiro Okabayashi, Tokyo; Kazuo Kondo, Tokyo; Yoichi Tamura, Tokyo; Yasuo Nakatsuka, Tokyo, all of Japan

[73] Assignees: Canon Kabushiki Kaisha, Tokyo; Sumitomo Metal Industries, Ltd., Osaka, both of Japan

[21] Appl. No.: 221,970

[22] Filed: Apr. 4, 1994

Related U.S. Application Data

[63] Continuation of Ser. No. 837,923, Feb. 20, 1992, abandoned.

[30] Foreign Application Priority Data

| Feb. 22, 1991 | [JP] | Japan | 3-053897 |
| Feb. 22, 1991 | [JP] | Japan | 3-053898 |
| Mar. 26, 1991 | [JP] | Japan | 3-087596 |
| Mar. 27, 1991 | [JP] | Japan | 3-089828 |

[51] Int. Cl.[6] .................................................. H01R 9/09
[52] U.S. Cl. .................................................. 439/91; 174/264
[58] Field of Search .................................. 439/66, 91; 29/884, 29/876, DIG. 31; 174/261–264, 265, 266, 267; 228/180.22

[56] References Cited

U.S. PATENT DOCUMENTS

| 3,040,119 | 6/1962 | Granzow | 174/264 |
| 3,495,207 | 2/1970 | Keller | 174/167 |
| 3,541,222 | 11/1970 | Parks et al. | 174/261 |
| 3,880,486 | 4/1975 | Avakian | 439/75 |
| 3,889,350 | 6/1975 | Mocarski | 29/DIG. 31 |
| 3,904,934 | 9/1975 | Martin | 439/66 |
| 4,240,198 | 12/1980 | Alonzo | 29/876 |
| 4,563,543 | 1/1986 | Kersuzon et al. | 174/68.5 |
| 4,673,772 | 6/1987 | Satoh et al. | 228/180.2 |
| 4,713,494 | 12/1987 | Oikawa et al. | 174/262 |
| 4,885,662 | 12/1989 | Bartholomew | 361/388 |
| 4,926,549 | 5/1990 | Yoshizawa et al. | 29/876 |
| 4,949,455 | 8/1990 | Nakamura et al. | 29/843 |
| 5,049,084 | 9/1991 | Bakke | 439/66 |
| 5,058,800 | 10/1991 | Yoshizawa et al. | 228/180.2 |
| 5,071,359 | 12/1991 | Arnio et al. | 439/91 |

FOREIGN PATENT DOCUMENTS

| 0 063 843 | 11/1982 | European Pat. Off. . |
| 0 284 820 | 10/1988 | European Pat. Off. . |

(List continued on next page.)

OTHER PUBLICATIONS

Electronics Magazine, A Simpler Way To Mount High–Pin––Count Modules, by Rogers Corp. Nov. 1986.
Tecknit Article, Conductive Elastomeric Connector, Data Sheet CEC–101, Jul. 1974.

*Primary Examiner*—Neil Abrams
*Attorney, Agent, or Firm*—Fitzpatrick, Cella, Harper & Scinto

[57] ABSTRACT

An electrical connecting member is provided with a holding member made of an electric insulating material and a plurality of conductive members held by the holding member in a state of being insulated with each other. One end of each of the conductive members is exposed on one surface of the holding member and the other end of each of the conductive members is exposed on the other surface of the holding member. The conductive members have portions exposed from the holding member, the length of which is longer than the thickness of the holding member. These exposed portions are easily deformed by the pressure force exerted at the time of connecting electric circuit components to reduce the coupling load even when there is irregularity in the heights thereof or unevenness in the junctions of the objects connection, hence enabling high density connections between the electric circuit components. The exposed portions can also be formed to have empty holes 1B, to be porous or, in the alternative, annealed to soften the exposed portions.

2 Claims, 17 Drawing Sheets

FOREIGN PATENT DOCUMENTS

| | | |
|---|---|---|
| 0 329 314 | 8/1989 | European Pat. Off. . |
| 0327399 | 8/1989 | European Pat. Off. . |
| 0344720 | 12/1989 | European Pat. Off. . |
| 59-139636 | 8/1984 | Japan . |
| 63-222437 | 9/1988 | Japan . |
| 63-228726 | 9/1988 | Japan . |
| 63-246835 | 10/1988 | Japan . |
| 2-43985 | 2/1990 | Japan . |

F I G. 1 A 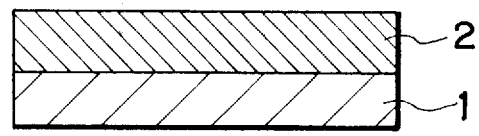
F I G. 1 B 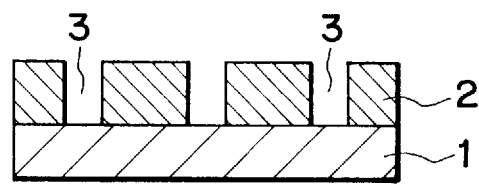
F I G. 1 C 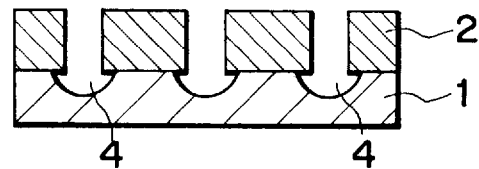
F I G. 1 D 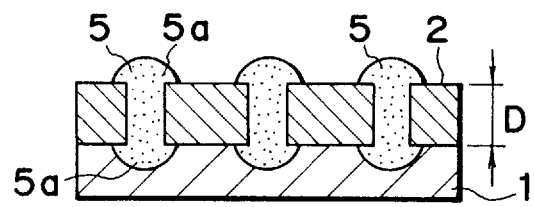
F I G. 1 E 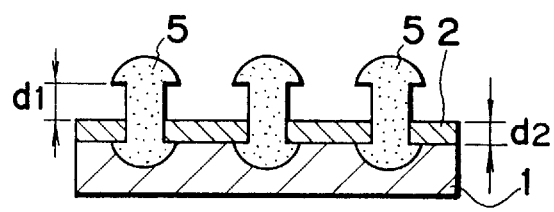
F I G. 1 F 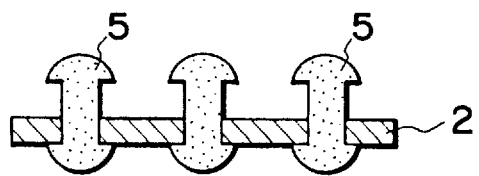

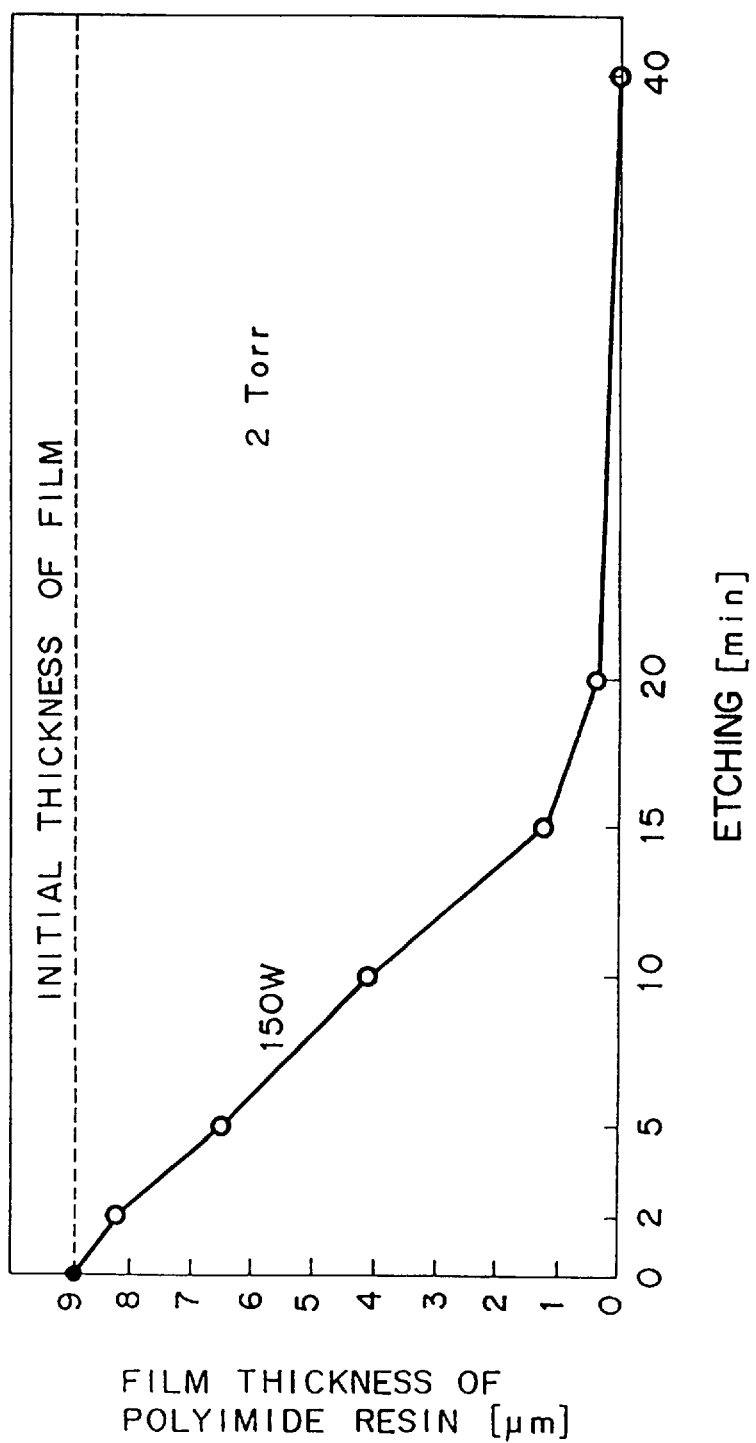

F I G. 3A 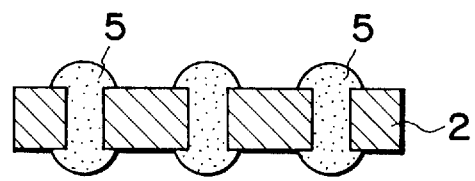
F I G. 3B 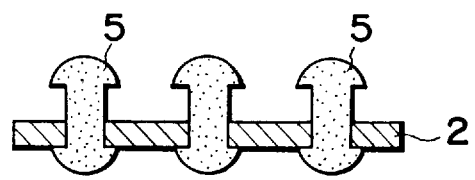
F I G. 4A 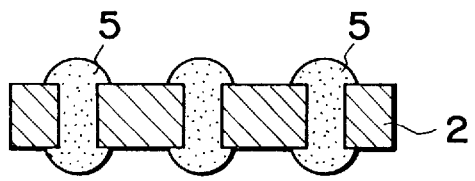
F I G. 4B 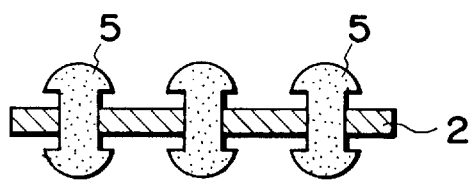

F I G. 14
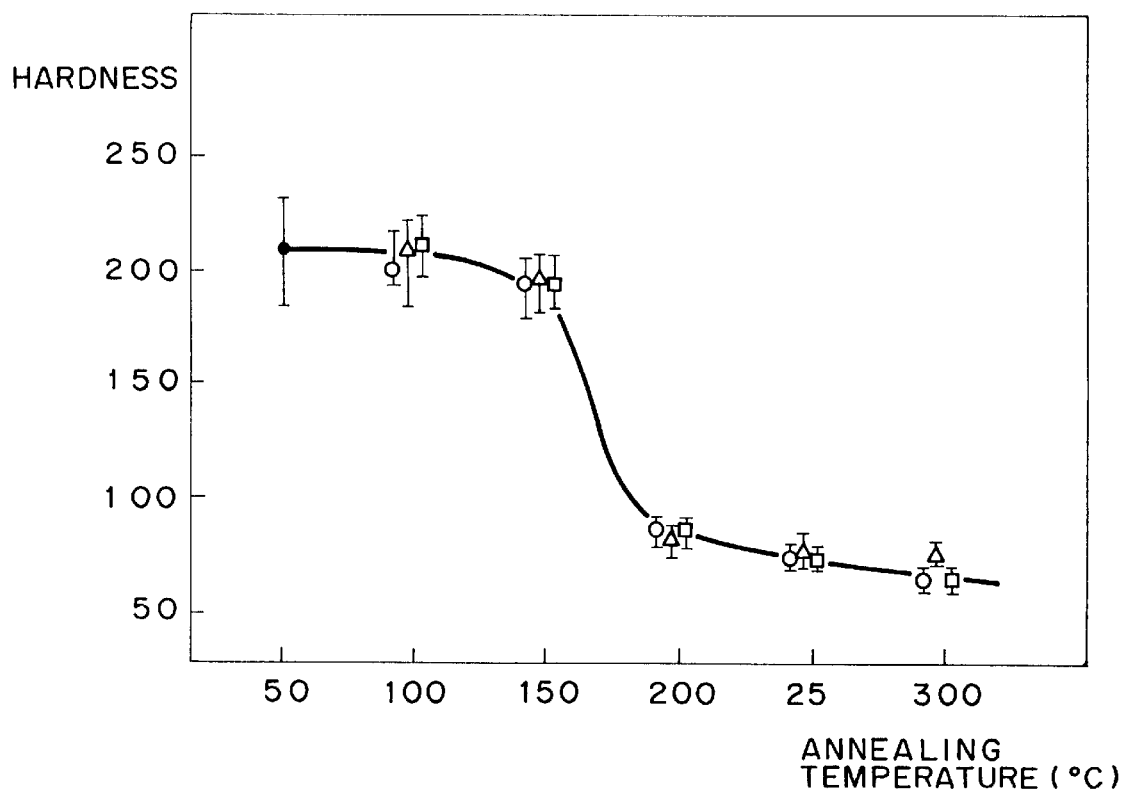

ELECTRICAL CONNECTING MEMBER

This application is a continuation of application Ser. No. 07/837,923, filed Feb. 20, 1992, now abandoned.

BACKGROUND OF THE INVENTION

1. Field of the Invention

The present invention relates to an electrical connecting member for electrically connecting electrical circuit components and a manufacturing method therefor.

2. Related Background Art

As a method for obtaining electrical connecting states between electric circuit components, there are a wire bonding method and an automated bonding method using the tape carrier system which are disclosed in Japanese Patent Laid-Open Application No. 59-139636 and others, that is, the so-called TAB (Tape Automated Bonding) method.

However, not only do these methods involve high costs, but with them, the numbers of junctions are increased between the electric circuit components, and still more there is encountered a problem that it is impossible to apply them if the density of the junctions becomes high.

Also, with these methods, an overall connecting condition cannot be obtained between many of the junctions. As a result, an enormous amount of processes are required, thus creating a problem that the cost reduction is limited.

To overcome such difficulties, there is known a technique to connect electric circuit components themselves electrically using the electrical connecting members held in the insulated containers in which a plurality of conductive members are provided in an insulated state with each other.

For manufacturing an electrical connecting member such as this, there have been proposed those methods which are disclosed in Japanese Patent Laid-Open Application No. 63-222437, Japanese Patent Laid-Open Application No. 63-228726, Japanese Patent Laid-Open Application No. 63-246835, and Japanese Patent Laid-Open Application No. 2-49385, for example.

FIG. 17A and FIG. 17B are views schematically illustrating such electrical connecting members as well as the electrical connection between the electric circuit components using this member. In FIG. 17, a reference numeral 171 designates an electrical connecting member, and 172 and 173, the electric circuit components to be connected. The electrical connecting member 171 is constructed with a holding member 175 made of an electrical insulator containing a plurality of conductive members 174 made of metals or alloys in such a manner that the conductive members 174 are electrically insulated from themselves. One end portion 178 of the conductive member 174 is projected toward one of the electric circuit components 172 side while the other end portion 179 of the conductive member 174 is projected toward the other one of the electric circuit component 173 side (FIG. 17A). Then, to the junctions 176 of one of the electric circuit components 172, the one projected end portions 178 of the conductive member 174 are coupled by the thermocompression bonding or compression bonding which causes them to be deformed and alloyed while to the junctions 177 of the other one of the electric circuit component 173, the other projected end portions 179 of the conductive member 174 are coupled by the thermocompression bonding which causes them to be deformed and alloyed or compression bonding which causes them to be deformed (FIG. 17B). In this way, the corresponding junctions 176 and 177 of the electric circuit components 172 and 173 are connected.

In an electrical connecting member such as this, there are the advantages given below.

(1) The junctions of the electric circuit component can be made small by making the size of the conductive member fine, and the number of junctions can also be increased. Hence, the electric circuit components themselves can be connected with a high density.

(2) Even for the electric circuit components having different thicknesses, it is possible to make the height of the electric circuit components always constant by changing the thicknesses of the electrical connecting members. Consequently, a multi-layer connection can be implemented easily and an assembly can be performed with a higher density.

(3) It is possible to perform a stabilized connection by making the height of the projections of the conductive member to be coupled to the junctions of the electric circuit component even when the junctions of the electric circuit component are lower than the surface. Accordingly, the electric circuit components themselves can be connected easily even if their shapes are complicated.

For manufacturing an electrical connecting member of the kind, there has been proposed a conventional method which is disclosed in Japanese Patent Laid-Open Application No. 2-49385. Hereinafter, in conjunction with FIG. 18, this manufacturing method will be described.

FIG. 18A through FIG. 18E are cross-sectional views schematically illustrating the principal processes of the method for manufacturing an electrical connecting member. At first, a metallic sheet 181 is prepared for a substrate (FIG. 18A). Then, on this metallic sheet 181, a negative-type photosensitive resin film 182 is formed by coating polyimide resin and others to construct a holding member by spinners, and a prebaking is given at a temperature of approximately 100° C. (FIG. 18B). Light is irradiated on the photosensitive resin film 182 through a photomask (not shown) having a predetermined pattern to cause it to be exposed and developed (FIG. 18C). Thus, the photosensitive resin film 182 is left on the exposed portions whereas the photosensitive film on the portions which are not exposed is removed by the development treatment to form holes 183 at the bottom of which the surface of the metallic sheet 181 is exposed. The photosensitive resin film 182 is hardened by raising the temperature from to 200° to 400° C. Then, the member thus processed is immersed in an etching solution and the etching is given to the exposed surface of the metallic sheet in the holes 183 to form the concavities 184 which are conductively connected to the holes 183 respectively (FIG. 18D). Subsequently, a gold plating is given with the substrate 181 as its common electrode to fill the holes 183 and concavities 184 with a conductive member 185 such as gold or the like as well as to raise it on the surface of the photosensitive resin film 182 to a predetermined height for the formation of bumps (FIG. 18E). Lastly, the metallic sheet 181 is removed by etching to produce the electrical connecting member 1 which is constructed to hold the conductive member 185 with the photosensitive resin film 182 as its holding member (FIG. 18F).

In this respect, the dimension of each part of the electrical connecting member 1 is as shown in FIG. 18F: the thickness of the photosensitive resin 182 is approximately 10 $\mu$m, the diameter of the hole 183 (the column portion of the conductive member 185) is approximately 20 $\mu$m, the pitch is approximately 40 $\mu$m, the height of the projections of the conductive member 185 are approximately several $\mu$m each for the front and rear.

In the electrical connecting member 1 thus manufactured, gold 185 constitutes the conductive member while the photosensitive region 182 constitutes the holding member. The conductive member comprises the portion 185a (hereinafter referred to as column portion 185a) and the portion 185b projecting from both faces of the holding member 182 (the end portion of the conductive member in FIG. 18, hereinafter referred to as bump portion 185b). Here, the dimension of each of the electrical connecting member 1 is that the thickness of the holding member 182 (photosensitive resin) is approximately 10 $\mu$m; the diameter of the conductive member 185 (column portion 185a), approximately 15 $\mu$m; pitch, approximately 40 $\mu$m; and the projecting amount of the conductive member 185, several $\mu$m each for the front and rear.

FIG. 19 illustrates the connecting embodiment of the electric circuit components by this electrical connecting member 1. In FIG. 19, reference numerals 194 and 195 designate the objective electric circuit components to be connected. When these components are connected using the electrical connecting member 1, the electric circuit components 194 and 195 are placed along the front and rear faces of the holding member 2 respectively, and the electrodes 40 and 50 which will be the respective connecting ends are adjusted by plain sight and then these electric circuit components 194 and 195 are pressed by an appropriate means. Consequently, the aforesaid electrodes 40 and 50 are in contact under pressure with the exposed ends of the corresponding faces of the conductive member 193, and both of them are coupled metallically, so that the electrodes 40 and 50, that is, electric circuit components 194 and 195 are electrically connected through the conductive member 193.

Now, the projected height of the conductive member 185 from the holding member 182, that is, the projected height of the so-called bump is absolutely necessary as a surplusage for the deformation work to assure the connectivity between the electric circuit components 174 and 175 and junctions 176 and 177 as shown in FIG. 17B. In the conventional method, this projected height is defined by the depth of the etching against the surface of the metallic sheet 181 as shown in FIG. 18D, that is, the depth of the concavity 184, and the height of the raised portion of the conductive member 185 in the gold plating process as shown in FIG. 18E. However, in the above-mentioned method, it takes a long time to make the etching depth of the concavity 184 deeper and the height of the raised portion of the conductive member 185 higher. Still more, as they become deeper and higher, their irregularities become greater. Moreover, they tend to spread wider in the lateral direction and there is a possibility that the adjacent bumps themselves are in contact with each other. Therefore, there is a limit for making the projected height of the bumps greater only by modifying the etching and gold plating conditions.

If the projected height of the bump is low, the surplusage for the bump deformation work becomes small when the bump is in contact with the junctions 176 and 177 and others as shown in FIG. 17A and FIG. 17B. If, for example, a passivation film is provided for the protection of the junctions 176 and 177, there is a possibility that non-contacting state is generated due to the staged difference formed between the surface of the passivation film and those of the junctions 176 and 177. In order to prevent this, it is necessary to increase the contacting pressure between the electrical connecting member 1 and electric circuit components 172 and 173. Yet there occurs a problem that it is difficult to secure a sufficient reliability only by the enhancement of the contacting pressure.

Also, here, the projected ends of the conductive members 193, and the surfaces of the electrodes 40 and 50 which are in contact with each other when they are connected are not clean in general. They are covered by oxidation contamination layers (FIG. 19). Therefore, in order to obtain a reliable connecting state between the electric circuit components 194 and 195, it is necessary to exert a sufficient pressure when the electrodes 40 and 50 are in contact under pressure with the conductive members 193 so that the oxidation contamination layers in the contacting portions are destroyed to allow their newly available surfaces to be in contact for creating the metallic coupling state. In this respect, the required pressure is 50 to 100 kgf/mm$^2$ if both the conductive members 193 and the electrodes 40 and 50 are made of gold (Au). By this pressure, the conductive members 193 are compressed between the electrodes 40 and 50 to gain a deformation ratio of 30 to 40%. Then, in such a state, the newly available surfaces are contacted.

Nevertheless, it is difficult to equalize all over the exposed heights (at H in FIG. 20) of the conductive member 193 on the front and rear faces of the holding member 2. Generally, the conductive members 193 having various exposed heights are mixedly present on the faces of the holding member 2.

A connecting state by the electrical connecting member 1 such as this is shown in FIG. 19. In this case, the pressure exerted as described above is mostly consumed to compress the conductive members 193 which have greater exposed heights. Accordingly, sufficient deformation does not take place with respect to the conductive members 193, which have smaller exposed heights (conductive member 193 in the central portion of FIG. 19). Thus, between these conductive members and the electrodes 40 and 50, the metallic coupling state resulting from the contact of the newly available surfaces themselves cannot be obtained and part of the conductive members 193 within the adjustable region with respect to the electrodes 40 and 50 is not serviceable for connection. There is consequently a possibility that the increased electrical resistance is generated between the electrodes 40 and 50 and further, a defective conduction is invited therebetween.

On the other hand, there occurs the excessive deformations with respect to the conductive members 193 having greater exposed heights due to the intensive pressure exerted as described earlier. Accordingly, the extent of the expansion in each of the through holes 206 (FIG. 20) of the conductive members 193 becomes great and cracks due to this expansion are generated in the holding member 202 and conductive members 203 themselves, leading to the possibility that a defective conduction is also invited.

Also, if a great force is added to couple the connecting member to the circuit substrate when they are coupled, the bump portion 185b which is in contact under pressure is expanded in the lateral direction as much as approximately 1.3 times. Therefore, if there are irregularities in the height of the bump portion 185b for each of the conductive members 185, adjacent conductive members 185 are caused to be in contact with each other, which can result in a short circuit. However, it is not easy to manufacture electrical connecting members 1 having the equal height of the bump portion 185b for each of the conductive members 185. There inevitably exists a slight irregularity in the heights thereof. Therefore, it is necessary to define the coupling pitches taking this irregularity into account, hence leading to a limit in implementing the higher coupling density. There is a further room for improvement in this respect.

SUMMARY OF THE INVENTION

In consideration of the above-mentioned situation, the present invention has been designed and it is an object of the invention to provide an electrical connecting member capable of connecting circuit components themselves reliably and easily.

It is another object of the present invention to provide an electric connecting member whereby to implement the lower load given to the thermocompression or compression bonding even when the heights of the bump portions are irregular, the prevention of the expansion of the bump portions, and the accompanying high density coupling between electric circuit components as well as the manufacturing method therefor.

It is still another object of the present invention to provide an electrical connecting member capable of effectively preventing the increase of electric resistance and defective conduction to be generated due to the irregularity in the exposed heights of the conductive members on the holding member when electric circuit components are coupled.

It is a further object of the present invention to provide an electrical connecting member which enables the projected height of a bump to be great so as to secure a sufficient surplusage for the deformation work and the manufacturing method therefor.

In order to achieve the above-mentioned objects, a principal electrical connecting member according to the present invention has a holding member formed by an electric insulator and a plurality of conductive members held by this holding member in a state to insulate each other, and one end of each of the conductive members is exposed to one face of the holding member while the other end of each of the conductive members is exposed to the other face of the holding member, and the length of the exposed portions of the conductive members is longer than the thickness of the holding member, or the length of the intervals between the bumps of the conductive members is longer than the length of the portions held by the holding member, or each of the conductive members has an empty hole in its inner part, or each of the conductive members has been given a softening treatment.

On the other hand, the principal method for manufacturing an electrical connecting member having a holding member formed by an electric insulator and a plurality of conductive members held by this holding member in a state to insulate each other, and one end of each of the conductive members being exposed to one face of the holding member while the other end of each of the conductive members being exposed to the other face of the holding member is a method in order to achieve the above-mentioned objects of the present invention, comprising the steps of:

forming a layer of an insulating material which becomes a holding member on the face provided with the conductivity of a substrate;

forming a plurality of holes on the layer of the insulating material so that a plurality of the holes with the substrate surface is exposed;

etching the exposed substrate surface to form irregularities thereon;

filling the aforesaid concavities and holes with a conductive material and depositing the conductive material over the aforesaid holes; and thinning the aforesaid layer of the insulating material, or forming on the conductive surface of a substrate a photosensitive resin film which becomes a holding member;

forming the aforesaid holding member by causing the aforesaid photosensitive resin film to be exposed and developed to form a plurality of the holes in which the aforesaid substrate surface is exposed;

etching the aforesaid exposed substrate surface to form concavities;

filling the aforesaid concavities and holes with a conductive material and depositing the conductive material over the aforesaid holes; and thinning the aforesaid layer of the insulating material, or forming on the conductive surface of a substrate a plurality of photosensitive resin films which become a holding member;

forming the aforesaid holding member by causing the aforesaid photosensitive resin film to be exposed and developed to form a plurality of the holes in which the aforesaid substrate surface is exposed;

etching the aforesaid exposed substrate surface to form concavities;

filling the aforesaid concavities and holes with a conductive material and depositing the conductive material over the aforesaid holes;

removing the aforesaid substrate; and removing a part of the aforesaid holding member, or forming on the conductive surface of a substrate a layer of an insulating material which becomes a holding member;

forming a plurality of the holes in which the substrate surface is exposed by forming a plurality of holes on the aforesaid layer of the insulating material;

etching the aforesaid exposed substrate surface to form concavities;

filling the aforesaid concavities and holes with a conductive material and depositing the conductive material over the aforesaid holes;

eluting a part of a plurality of conductive members; and removing the substrate, or causing the insulating material which becomes a holding to form and hold a conductive member; and giving a softening treatment to the conductive member thus held.

With the structures described above, the conductive members are projected above the surface of the holding member to the height corresponding to the portions of the holding member which have been thinned, thus making it possible to obtain an electrical connecting member capable of providing the sufficient surplusage for the deformation work.

Also, the conductive member can be projected above the surface of the holding member to the extent corresponding to the thickness of the layer of the photosensitive resin film which has been removed. Hence obtaining an electrical connecting member capable of providing the sufficient surplusage for deformation work.

Also, there exists an empty hole for each of the conductive members. Therefore, the apparent hardness is low and it is good enough to apply a lower load when the load is given for coupling, thus making possible the provision of an electrical connecting member having a smaller lateral expansion.

Also, subsequent to having plated a plurality of conductive materials in many holes formed in the insulating layer, a part thereof is eluted. Thus, it is possible to manufacture an electrical connecting member provided with the conductive member in which empty holes are formed.

Also, the golden conductive member filled in the through holes in the holding member is softened so that it can be deformed easily with the pressure given when the electric circuit components are coupled. By this deformation, the difference in the exposed heights on the surface of the holding member can be absorbed, and the metallic coupling between the electrodes and the conductive members is desirably performed even in the case of its exposed heights being small. Moreover, the excessive deformation created for the conductive members having large exposed heights is also absorbed mostly by the deformation on the surface of the holding member. As a result, the expanding deformation amount in the through holes formed in the holding is made smaller. Hence, the possibility to generate the accompanying crackings in the holding member or conductive members can be reduced.

BRIEF DESCRIPTION OF THE DRAWINGS

FIG. 1A through FIG. 1F are cross-sectional views schematically illustrating the principal manufacturing processes for an embodiment according to an embodiment of the present invention;

FIG. 2 is a graph showing the relationship between the ashing amount of the photosensitive resin film and the ashing time according to an embodiment of the present invention;

FIG. 3A and FIG. 3B are cross-sectional views schematically illustrating the principal manufacturing processes for an embodiment according to the present invention;

FIG. 4A and FIG. 4B are cross-sectional views schematically illustrating the principal manufacturing processes for an embodiment according to the present invention;

FIG. 14 is a graph showing the results of the hardness tests of the conductive members to which an annealing treatment is given under various temperature conditions;

DETAILED DESCRIPTION OF THE PREFERRED EMBODIMENTS

Figure 5A:
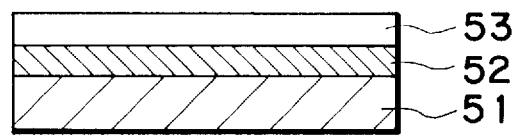
FIG. 5A through FIG. 5G are cross-sectional views schematically illustrating the principal manufacturing processes for an embodiment according to the present invention.
Figure 5B:
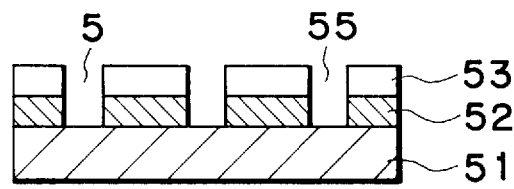

Hereinafter, in conduction with the accompanying drawings, the specific description will be made of embodiments according to the present invention.

FIG. 1A through FIG. 1F are cross-sectional views schematically illustrating the principal manufacturing processes for a first embodiment according to the present invention. At first, as a substrate, a copper plate is prepared with a tungsten (W) film formed by deposition on the surface thereof, for example. On this substrate 1, a photosensitive resin such as polyimide resin is coated in an even thickness to construct a holding member. Thus, a photosensitive resin film 2 is formed, which is prebaked (FIG. 1A) to cause the photosensitive resin film 2 to be exposed and developed so that holes 3 are formed with the tungsten film on the surface of the substrate 1 being exposed at the bottom of the holes (FIG. 1B). The substrate is immersed in an etching solution in this state, and the surface of the substrate 1 exposed in the holes 3 is etched to form concave holes 4 (FIG. 1C).

By a plating with the substrate 1 as electrodes, conductive members 5 of gold or the like are filled in each of the holes 3 and concave holes 4, and the conductive members 5 are raised over the surface of the photosensitive resin film 2 above the holes 3. In this state, the conductive members 5a which are raised over the photosensitive resin film 2 become bumps (FIG. 1D). Subsequently, the photosensitive resin film 2 is thinned to a ½ or less of its initial thickness by etching using an $O_2$ plasma (FIG. 1E). Then, the substrate 1 is removed by a selective etching to allow the conductive members 5 to constitute electrical conductive material and the photosensitive resin film 2 to constitute a holding member, hence obtaining an electrical connecting member with the one end of each conductive member 5 being projected greatly above the holding member (FIG. 1F). Now, for example, given the thickness of the photosensitive resin film 2 as D, it is thinned by etching by an amount of $d_1$ to make the thickness of the photosensitive resin film 2 approximately $d_2$. Here, in the present embodiment, $d_1 \geq d_2$.

FIG. 2 is a graph showing the relationship between the etching amount and etching time when the photosensitive resin film 2 made of a polyimide resin is etched using an $O_2$ plasma. In this respect, the output of the $O_2$ plasma formed 150 W. As clear from this graph, the time required for thinning the photosensitive resin film 2 of 9 μm thick to a ½ or less of its initial thickness is just about 10 minutes.

In the embodiment 1 such as this, it is possible to define the projected height of the bumps arbitrarily by setting the thickness of the photosensitive resin film 2 and the thinning degree to follow appropriately.

(Embodiment 2)

FIG. 3A and FIG. 3B are cross-sectional views schematically illustrating the principal processes for another embodiment according to the present invention. In the embodiment 2, the substrate 1 is removed by etching (FIG. 2A) subsequent to the processes in FIG. 1A through FIG. 1D as in the case of the embodiment 1. Then, on one side of the photosensitive resin film 2, an excimer laser beam is irradiated to transpire the photosensitive resin film 2 from the surface side for a predetermined thickness. Thus, the film thickness of the photosensitive resin film 2 is thinned to ½ or less (FIG. 2B). In this way, it is possible to obtain an electrical connecting member with one end of each conductive member 5 being greatly projected from the surface of the photosensitive resin film 2 which is a holding member.

In this embodiment 2, it is possible to define the projected height of the bumps arbitrarily by setting the initial thickness of the photosensitive resin film 2 and the thinning degree by the irradiation of the excimer laser beam appropriately.

(Embodiment 3)

FIG. 4A and FIG. 4B are cross-sectional views schematically illustrating the principal processes for embodiment 3 according to the present invention. In the embodiment 3, the substrate 1 is removed by etching (FIG. 4A) subsequent to the processes in FIG. 1A through FIG. 1D as in the case of the embodiment 1. Then, the photosensitive resin film 2 is etched from both sides to make the thickness of the photosensitive resin film 2 a ½ or less of its initial thickness. The etching amount of the photosensitive resin film 2 may be equal for both sides or different. Further, the etching means can be of a wet type or a dried type.

In the embodiment 3 such as this, the bumps are projected for an amount equal to the etching amount for both sides of the photosensitive resin film 2 respectively from the photosensitive resin film which is an insulated holding member, hence making it possible to define the projected heights for each of the bumps from both sides of the holding member arbitrarily. As a result, there is an advantage that a large surplusage for the bump deformation can be obtained for each of them.

Now, in conjunction with FIG. 5A through FIG. 5G, a forth embodiment according to the present invention will be described specifically.

(Embodiment 4)

Figure 5C:
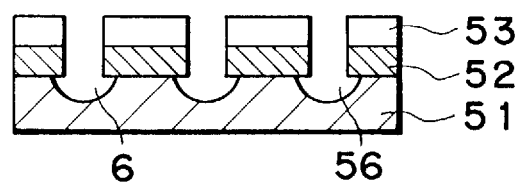
Figure 5D:
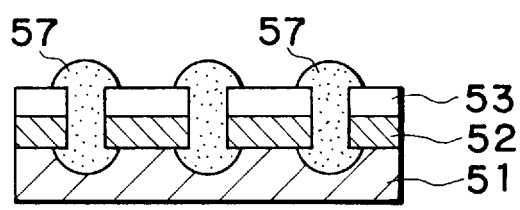
Figure 5E:
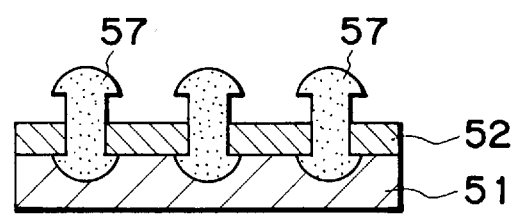
Figure 5F:
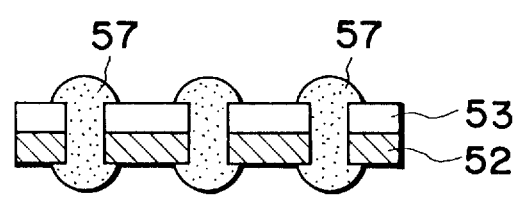
Figure 5G:
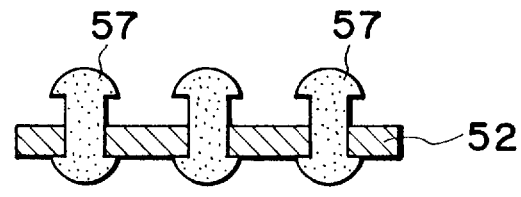

FIG. 5A though FIG. 5G are cross-sectional views illustrating the principal manufacturing processes for the embodiment 1 according to the present invention. At first, as a substrate, a copper plate 51 is prepared with a tungsten (W) film formed by deposition on the surface thereof, for example (FIG. 5A). On this copper plate 51, a first photosensitive resin film such as polyimide resin film 52 is coated in an even thickness to construct a holding member and after prebaking, a resist 53 is coated to constitute a second photosensitive resin film on the surface thereof. After being prebaked, the polyimide resin film 52 and resist 53 are exposed and developed so that holes 55 are formed with the W film on the surface of the copper plate 51 which is exposed at the bottom of the holes, (FIG. 4B). The copper plate is immersed in an etching solution in this state, and the surface of the copper plate 1 exposed in the holes 55 is etched to form concave holes 56 (FIG. 5C).

By a plating with the copper plate 51 as electrodes, conductive members 57 of gold or the like are filled in each of the holes 55 and concave holes 56, and the conductive members 57 are raised over the surface of the resist 53 above the holes 55 (FIG. 5D). After that, the hard baked resist 53 is removed by etching using an $O_2$ plasma (FIG. 5E) or the copper plate 51 is removed by a selective etching (FIG. 5F). Thus, the conductive members 57 constitute an electrical conductive material while the polyimide resin film 52 which serves as the first photosensitive resin film constitutes the holding member. In this way, an electrical connecting member is manufactured with the part of the conductive members 57 being greatly projected above the holding member (FIG. 5G).

In an embodiment such as this, it is possible to define arbitrarily the projected height of the bumps by setting appropriately the thickness of the resist 3 which is the second photosensitive resin film.

(Embodiment 5)

In this embodiment 5, the deposition sequence of the polyimide resin film 2, a first photosensitive resin and the resist 3, a second photosensitive resin, which constitutes a holding member on the surface side of the copper plate 61 with a tungsten film formed thereon, is opposite to the sequence in the case of the embodiment 1. That is, on the copper plate 61, the resist 3 is first deposited and then the polyimide resin film 2 is formed by deposition in this sequence as shown in FIG. 6. The other processes are substantially the same as in the embodiment 1. At first, a resist 63 is coated on the copper plate 61 with the tungsten (W) film on the surface thereof. After prebaking, the polyimide resin is coated by deposition to form the polyimide film 62.

Figure 6A:
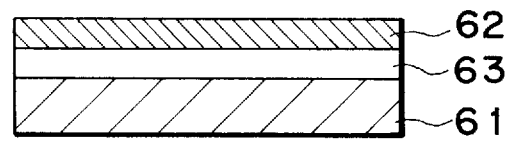
FIG. 6A through FIG. 6F are cross-sectional views schematically illustrating the principal manufacturing processes for an embodiment according to the present invention.
Figure 6B:
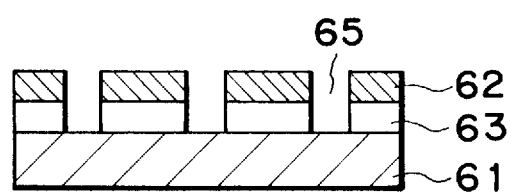
Figure 6C:
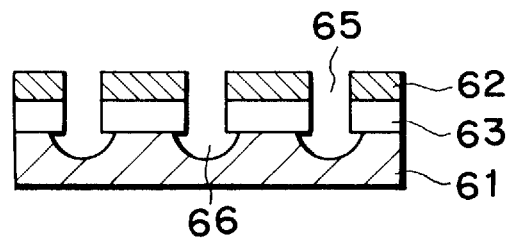
Figure 6D:
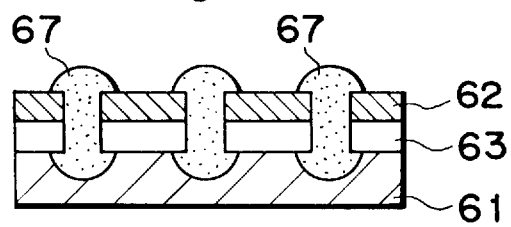
Figure 6E:
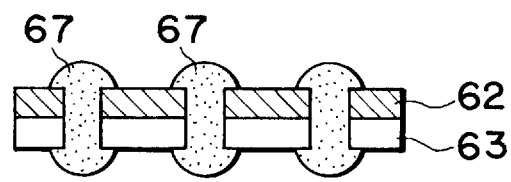
Figure 6F:
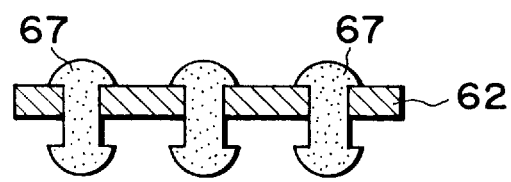

Subsequently, the polyimide resin film 62 is exposed from its surface side and is developed to form holes 65 the bottom of which the W film on the surface of the copper plate 61 is exposed. The polyimide resin film 62 and resist 63 are half baked (FIG. 6B). After concave holes 66 are formed by a plasma etching on the copper plate 61 (FIG. 6C), each holes 65 and concavity holes 66 are filled by the conductive member 67 of gold or the like with a plating using the copper plate 61 as electrodes. Further, the conductive members 67 are raised over the polyimide resin film 62 above the holes 65. Then, as shown in FIG. 6D and FIG. 6E, the copper plate 61 and resist 63 are sequentially removed, and as shown in FIG. 6F, an electrical connecting member is manufactured with the other end portions of the conductive members 67 are projected greatly toward the lower part of the holding member.

In this embodiment 5, it is also possible to define the projected heights of the bumps arbitrarily by setting the thickness of the resist 63 appropriately.

(Embodiment 6)

FIG. 7A through FIG. 7E are cross-sectional views schematically illustrating the principal processes for a sixth embodiment according to the present invention. In this embodiment 6, a resist 73 is at first coated on a copper plate 71 with a tungsten film formed on the surface thereof to constitute a second photosensitive resin film. After this is prebaked, a polyimide resin film 2 is coated to form a first photosensitive resin film. Further, thereon, a resist 74 is coated to form a third photosensitive resin film. This is also prebaked to make the photosensitive resin films in a three-layer state (FIG. 7A) in which it is exposed and developed from the surface side of the resist 74. The other processes are substantially the same as the embodiments 4 and 5.

Figure 7A:
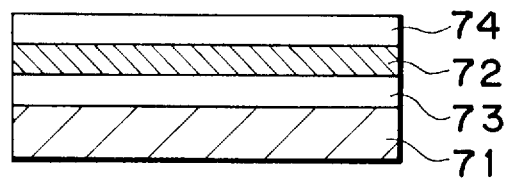
FIG. 7A through FIG. 7E are cross-sectional views schematically illustrating the principal manufacturing processes for an embodiment according to the present invention.
Figure 7B:
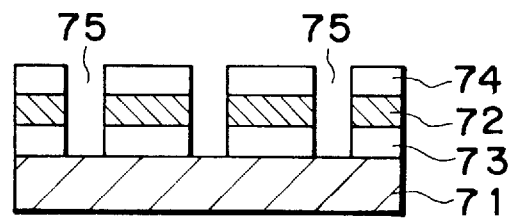
Figure 7C:
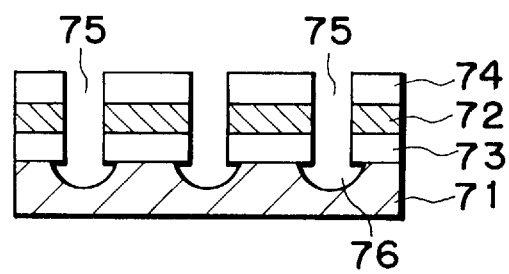

In other words, the exposure is given from the surface side of the resist 74 and the holes 75 are formed by development, at the bottom of which the W film on the surface of the copper plate 71 are exposed (FIG. 7B) and then concave holes 76 of a spherical shape are formed by a plasma etching on the surface portion of the copper plate 71 (FIG. 7C).

Figure 7D:
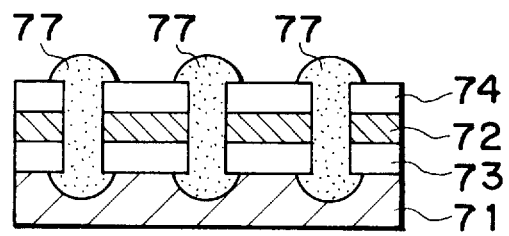
Figure 7E:
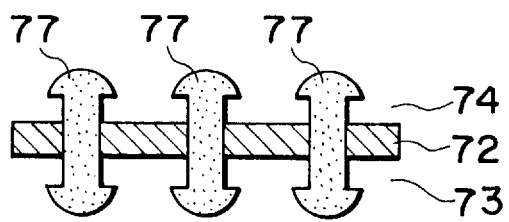

Subsequently, by a plating with the copper plate 71 as electrodes, conductive members 77 gold or the like are filled in the concave holes 76 and holes 75 and further, the conductive members 77 are raised over the surface of the resist 74 above the holes 75 (FIG. 7D). Subsequently, the copper plate 71, resists 73 and 74 are sequentially removed by etching. Then, the prebaked resists 73 and 74 are further removed by etching using an $O_2$ plasma. In this way, an electrical connecting member is manufactured, in which as shown in FIG. 7E, the conductive members 77 of gold or the like constitute electrical conductive members while the polyimide resin film 72 constitutes a holding member.

In an embodiment 6 such as this, the bumps are projectingly formed with the lengths from the both sides of the insulated holding member corresponding respectively to the thicknesses of the resists 73 and 74. The apparent projected heights of the bumps are great and there is an advantage that the surplusage for each of the bump deformation work becomes great.

(Embodiment 7)

Figure 8A:
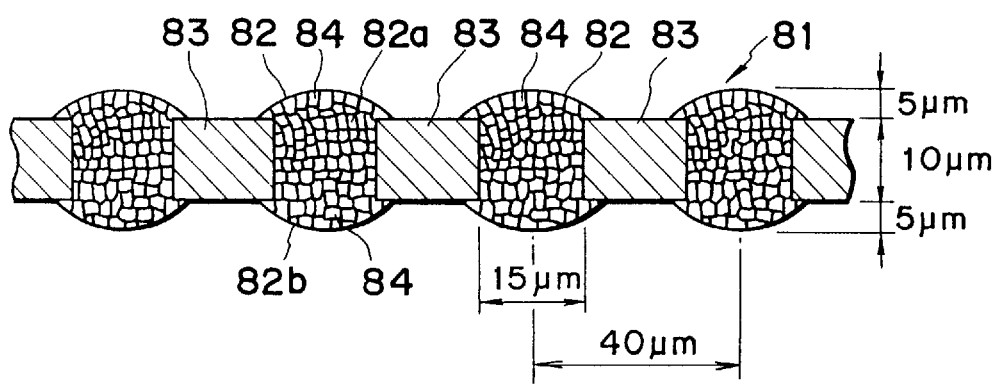
FIG. 8A and 8B are cross-sectional views illustrating an electrical connecting member according to an embodiment of the present invention.

FIG. 8A is a cross-sectional view illustrating an embodiment of an electrical connecting member according to the present invention. An electrical connecting member 81 comprises a plurality of conductive members 82 made of gold or the like, and a holding member 3 of a polyimide resin, for example, holding conductive members 82 in such a manner that the respective conductive members 82 are in an electrically insulated state themselves. Both ends of each of the conductive members 82 are projected from both faces of the holding member 83. Each of the conductive members comprises a column portion 82a planted in the holding member 83 and two bump portions 82b and 82b projected from the holding member 83. In each of the conductive members 82, there exists many empty holes 84 in its entire body (column portion 82a and in the bump portions 82b and 82b). In this respect, the dimension of each part of the electrical connecting member 81 is almost the same as the one conventionally available, and the thickness of the holding member 83 is approximately 10 μm, the diameter of the conductive member 82 (column portion 82a) is approximately 15 μm, the formation pitch of the conductive members 82 is approximately 40 μm, and the projected amount (the height of each of the bumps 82b and 82b) of the conductive member 82 is approximately 5 μm.

Figure 8B:
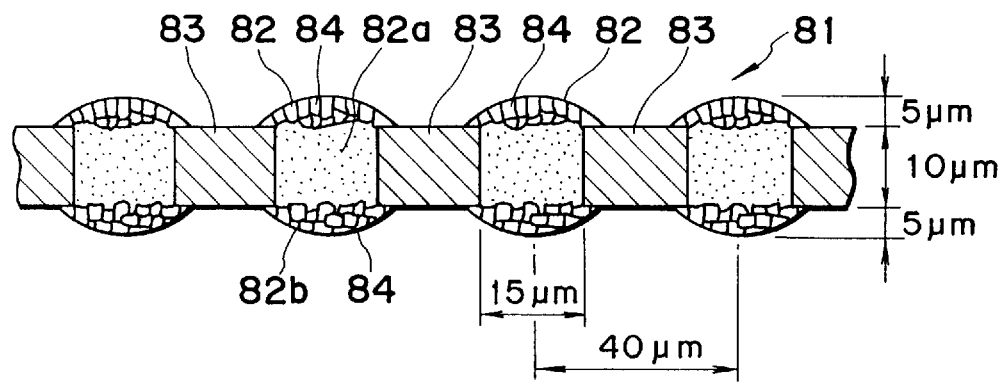

FIG. 8B is a cross-sectional view illustrating another embodiment of an electrical connecting member according to the present invention, in which those members having the same reference marks as in FIG. 8A designate the same members. In this example, many empty holes 84 exist in the bump portions 82b and 82b of each of the conductive member 82 made of gold or the like. However, no empty holes 84 are present in the column portion 82a. The other structures are the same as those shown in FIG. 8A.

Figure 10:
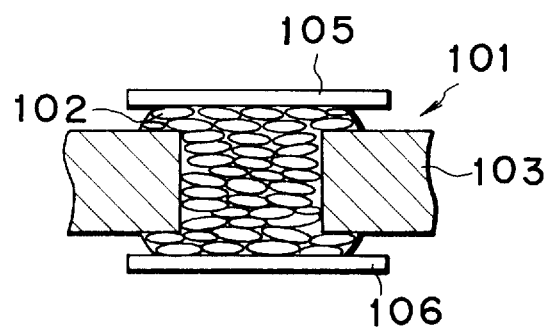
FIG. 10 is a cross-sectional view illustrating a connecting state of an electrical connecting member according to an embodiment of the present invention.

Now, using FIG. 8A, the description will be made of an example in which electric circuit components are connected. FIG. 10 is a cross-sectional view schematically illustrating this connecting state. The connecting portion 105 of one of the electric circuit components the, object to be connected, and the connecting portion 106 of the other electric circuit component are connected using the conductive member 82 of the electrical connecting member 81 shown in FIG. 8A. In this case, as the empty holes are provided in each of the conductive members 82, the lateral expansion of the bump portions is small and the height irregularity of each bump portion 82 can be absorbed. As a result, even if bump height irregularity exists, a short circuit is prevented between the adjacent bumps themselves, hence making possible a high density connection between the electric circuit components.

Figure 11:
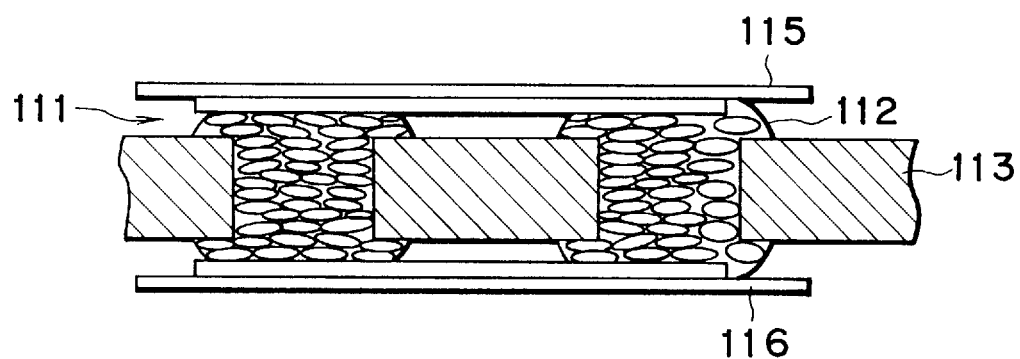
FIG. 11 is a cross-sectional view illustrating another connecting state of an electrical connecting member according to an embodiment of the present invention.

FIG. 11 illustrates another connecting state, in which a stage exists in the location where the connecting portions 115 and 116 are to be connected. Since the empty holes are provided in the conductive member 112, the effect produced by this stage is absorbed to enable the implementation of a high density connection between the electric circuit components.

In an electrical connecting member such as shown in FIG. 8B, the same function and effect as the electrical connecting member shown in FIG. 8A are displayed for the connecting portions between the corresponding electric circuit components. Here, in FIG. 8B, empty holes 84 exist in both of the bump portions 82b and 82b, but it may be possible to arrange the structure so that the empty holes 84 are present only in one of the bump portions 82b.

Now, a manufacturing method for an electrical connecting member of a structure such as this (a method for manufacturing an electrical connecting member according to the present invention) will be described. In a manufacturing method according to the present invention, empty holes are formed by selectively eluting only the predetermined metal contained in an alloy after it has been plated.

FIG. 9A through FIG. 9E are cross-sectional views schematically illustrating the process steps for an example of a manufacturing method according to the present invention.

Figure 9A:
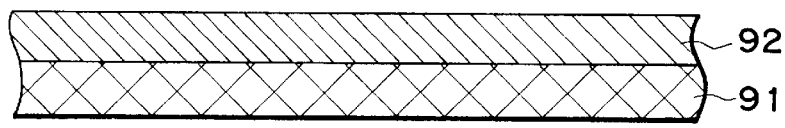
FIG. 9A through FIG. 9E are cross-sectional views schematically illustrating the manufacturing processes for an embodiment according to the present invention.

At first, on one surface of a prepared copper plate 91 serving as a substrate, a polyimide resin 92 which is a negative type photosensitive resin is coated by a spinning coater and is prebaked at a temperature of approximately 100° C. (FIG. 9A). Here, the film thickness of the coated polyimide resin 92 should be made thicker than a desired film thickness of the holding member for an electrical connecting member to be manufactured in consideration of the reduction resulting from the hardening contraction.

Figure 9B:
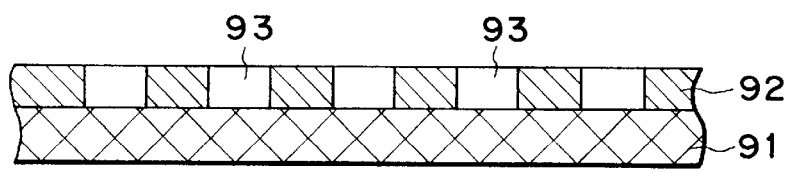

Subsequently, light is irradiated on the polyimide resin 92 (exposed) through a photomask having a predetermined pattern (not shown). Then a development is performed. In the present example, the polyimide resin 92 remains on the exposed portion while the polyimide resin 92 is removed by the development from the portion which is not exposed. Consequently, a plurality of holes 93 are formed in the polyimide resin 92 (FIG. 9B). Thereafter, the temperature is raised from 200° to 400° C. to harden the polyimide resin 92.

Figure 9C:
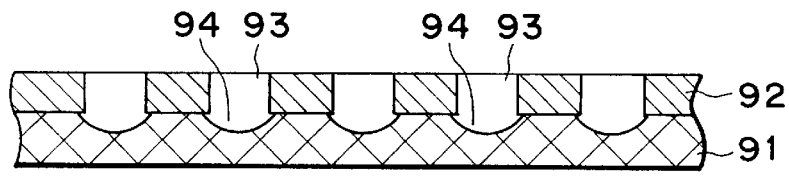

Then, the copper plate 91 thus treated is immersed in an etching solution to be etched. The copper plate 91 in the vicinity of the holes 93 is partially removed by etching to produce on the copper plate 91 the concavities 94 which are conductively connected to the holes 93 (FIG. 9C). At this juncture, the diameter of the concavities 94 thus formed should be larger than the diameter of holes 93 and smaller than half a distance to the outer periphery of the adjacent holes 93. In this way, by controlling the size of the concavities 94, the conductive members adjacent to each other themselves are not conducted, yet it is possible to manufacture an electrical connecting member from which the conductive members do not slip off.

Figure 9D:
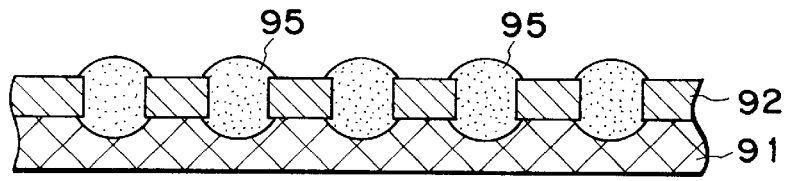

Subsequently, by an electrolytic plating with the copper plate 91 as electrodes, a plurality of conductive materials 95 are filled in the holes 93 and concavities 94 (FIG. 9D). As a specific example, gold and copper are filled in the holes 13 and concavities 14 using a gold-copper alloy plating solution (liquid composition: gold kalium cyanide 7.5 g/litter, copper kalium cyanide 150 g/litter, kalium cyanide 15 g/litter, sodium sulfite 15 g/litter) on a predetermined plating condition (PH: 7.0–7.6, temperature: 60° C., current density: 0.4 A/dm$^2$, agitation: non). Then, the filled conductive materials should have specific deposit characteristics (copper content: 40% (heterogeneous copper 18%), specific density: 15, hardness: 250 Hv).

Figure 9E:
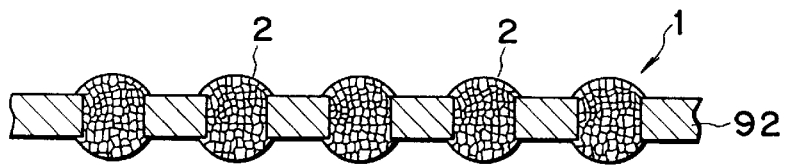

Lastly, using a copper etching solution, the copper plate 91 is removed by dissolution and at the same time, a part or all of the filled-in maldistributed copper is eluted. Specifically, FES 5,000 (Mitsubishi Gas Chemical) copper etching solution is used on a condition of etching at a temperature of 35° C. with an ultrasonic wave of 40 kHz× 200 W for 2 to 10 minutes. In this way, an electrical connecting member 1 as shown in FIG. 8A is manufactured (FIG. 9E).

In the above-mentioned processes, if the etching condition for the copper etching is adjusted, it is possible to manufacture an electrical connecting member 1 as shown in FIG. 8B.

In this respect, a gold and copper compound material is filled and the copper is eluted in the above-mentioned embodiment. However, this is just an example, and it may also be possible to fill in a compound material of gold, thallium, nickel, and cobalt, for example, and then elute metals other than gold with diluted nitric acid for the formation of a gold conductive member having empty holes. Also, in the above-mentioned embodiment, the substrate (copper plate 91) and the filled-in conductive material (maldistributed copper) are removed together, but it may be possible to perform the removal of the substrate and the elution of the specific conductive materials separately by different processes.

Also, as an insulating layer, a photosensitive polyimide resin is used, but it is not limited thereto. Further, while a photosensitive resin must be used when the holes are formed by exposure and development, it is not necessarily required to use any photosensitive resin if the holes are formed by the irradiation of a high energy beam, for example, instead of the exposure and development treatments.

Now, hereinafter, the present invention will be described in detail in conjunction with the drawings which illustrate the embodiment thereof. FIG. 12A through FIG. 12D and FIGS. 13A and 13B are views schematically illustrating the manufacturing processes of an electrical connecting member according to the present invention.

Figure 12A:
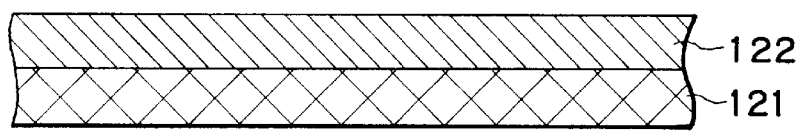
FIG. 12A through FIG. 12D are cross-sectional views schematically illustrating the manufacturing processes for an embodiment according to the present invention.

At first, as shown in FIG. 12A, a metallic plate (copper plate, for example) 121 is prepared for a substrate and on the metallic substrate 121, negative type photosensitive polyimide resin 122 is coated with an auxiliary adhesive agent. This polyimide resin 122 constitutes a holding member 2 for an electrical connecting member 1, which will be described later. The coating thickness of the polyimide resin 122 should be greater than the thickness of the holding member 2 to be obtained in consideration of the contraction and others which accompany the flying of the solvent and subsequent hardening process.

Figure 12B:
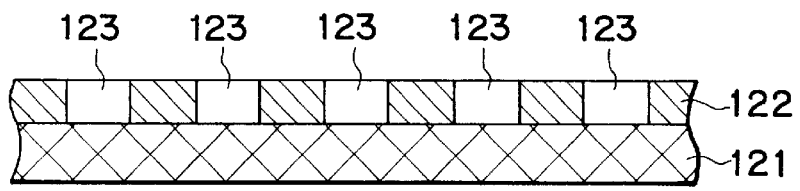

Then, the surface of the coated layer of the polyimide resin 122 is covered by a photomask (not shown) with a predetermined pattern formed thereon, and light is irradiated (exposed) through the aforesaid photomask. Further, a development treatment is given, thus removing the portions which have not been exposed to form many through holes 123 which are penetrated from the surface to a reverse side of the coated layer of polyimide resin 122 as shown in FIG. 12B.

Figure 12C:
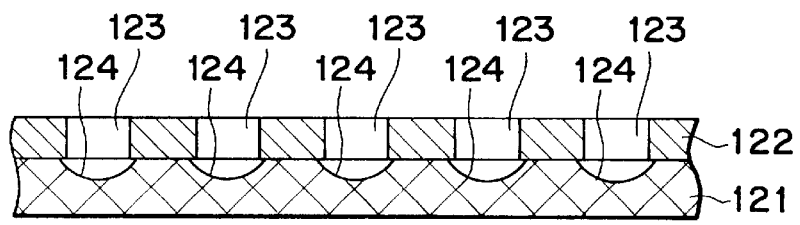

Subsequently, the temperature is raised to make the coated layer of polyimide resin 122 to be hardened with the imide, and then by etching from the surface side of this polyimide resin 122, the metallic plate 121 located below the through holes 123 is etched to form the concavities 124 as shown in FIG. 12C. Here, this etching treatment is given until the diameter of the concavities 124 is made slightly larger than the diameter of the through holes 123.

Figure 12D:
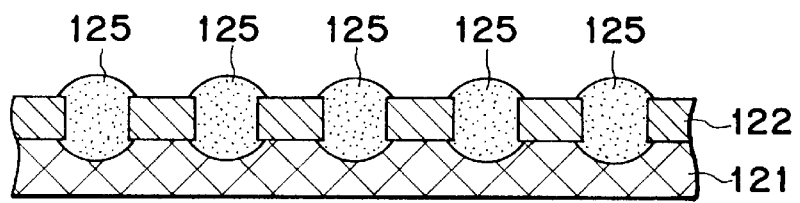

Subsequently, by an electric plating with the metallic plate 121 as electrodes, gold 125 is filled in each of the through holes 123 and concavities 124. This filling is terminated after raising the filling gold 125 over the upper end of the opening of each of the through holes 123 on the surface of the polyimide resin 122 to the extent corresponding approximately to the thickness of each of the concavities 124 as shown in FIG. 12D.

Figure 13A:
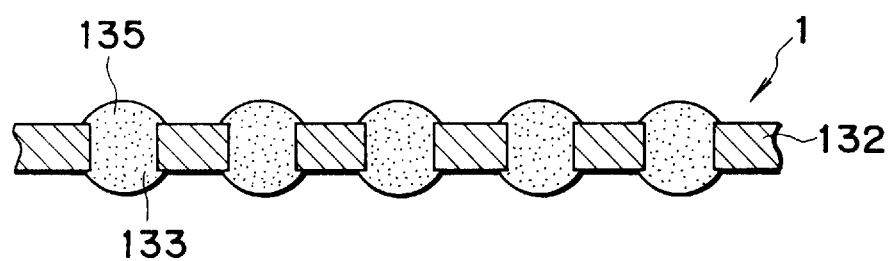
FIG. 13A and FIG. 13B are cross-sectional views schematically illustrating the manufacturing processes for an embodiment according to the present invention.

After the above-mentioned processes have been terminated, the substrate metallic plate 121 is removed by metal etching. Thus, as shown in FIG. 13A, an elemental product 1' is produced, in which the conductive members 135 made of gold 125 are filled in a state of insulating each other in many through holes 133 formed in the holding member 132 made of the polyimide resin 122 which serves as an insulator, and both ends of these conductive members are respectively exposed on the surface and rear face of the holding member 132. Here, it is needless to mention that this elemental product 1' is a conventional electrical connecting member.

Figure 13B:
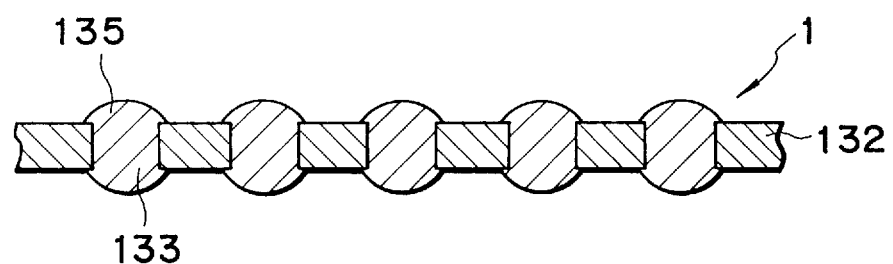

An electrical connecting member 1 according to the present invention is obtainable by giving an annealing treatment to the entire body of the elemental product 1' thus produced so as to soften the conductive members 135 made of gold 125 as shown in FIG. 13B. This annealing treatment should be given to the polyimide holding member 132 as well. Therefore, while the treatment is effective in softening the conductive members 135 made of gold 125, it should be given on a temperature condition of being less than the heat resistance temperature of the polyimide which constitutes the holding member.

FIG. 14 is a graph showing the results of the hardness tests given to the conductive members after the annealing treatments on various temperature conditions. In this respect, a reference mark ○ indicates the results obtainable when the treatment time is set for 30 minutes; △, for 60 minutes; and □, for 90 minutes, respectively. Further, a reference mark ● indicates the results obtainable when the treatment temperature is 0° C., that is, the test results of the conductive member 135 before the annealing treatments. In this respect, the annealing treatments for the conductive members 135 are performed in a vacuum drying oven sealed with $N_2$, and the aforesaid hardness tests are given using a conical indentator with a vertical angle of 115° under a test load of 2.0 gf.

As shown in FIG. 14, the hardness of gold conductive members 135 is significantly softened by annealing at comparatively low temperatures of approximately 200° C., and it is clear that the hardness at this time is as low as less than ½ of the hardness of the one indicated with ● for which no annealing has been given. The heat resistance temperature of the polyimide resin 132 which constitutes the holding member 2 is 320° to 330° C. Therefore, it is possible to obtain an electrical connecting member 1 according to the present invention by giving an annealing treatment to the aforesaid elemental product 1' at temperatures 200° to 300° C. for 30 to 90 minutes so as to soften only the conductive members 135, 135, and without causing any damage to the holding member 2.

Figure 15:
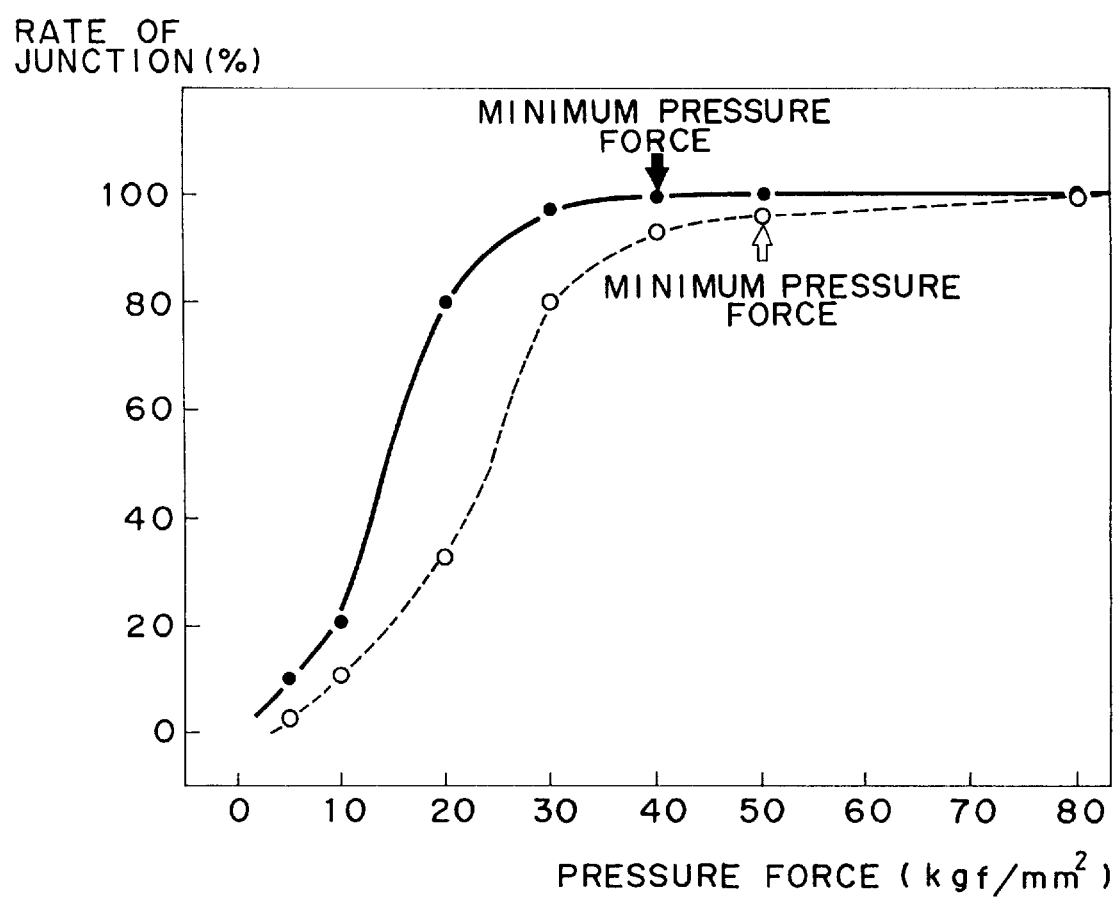
FIG. 15 is a graph showing the comparative results of the rates of junctions after the connections performed by an electrical connecting member according to an embodiment of the present invention and a conventional electrical connecting member.
Figure 16:
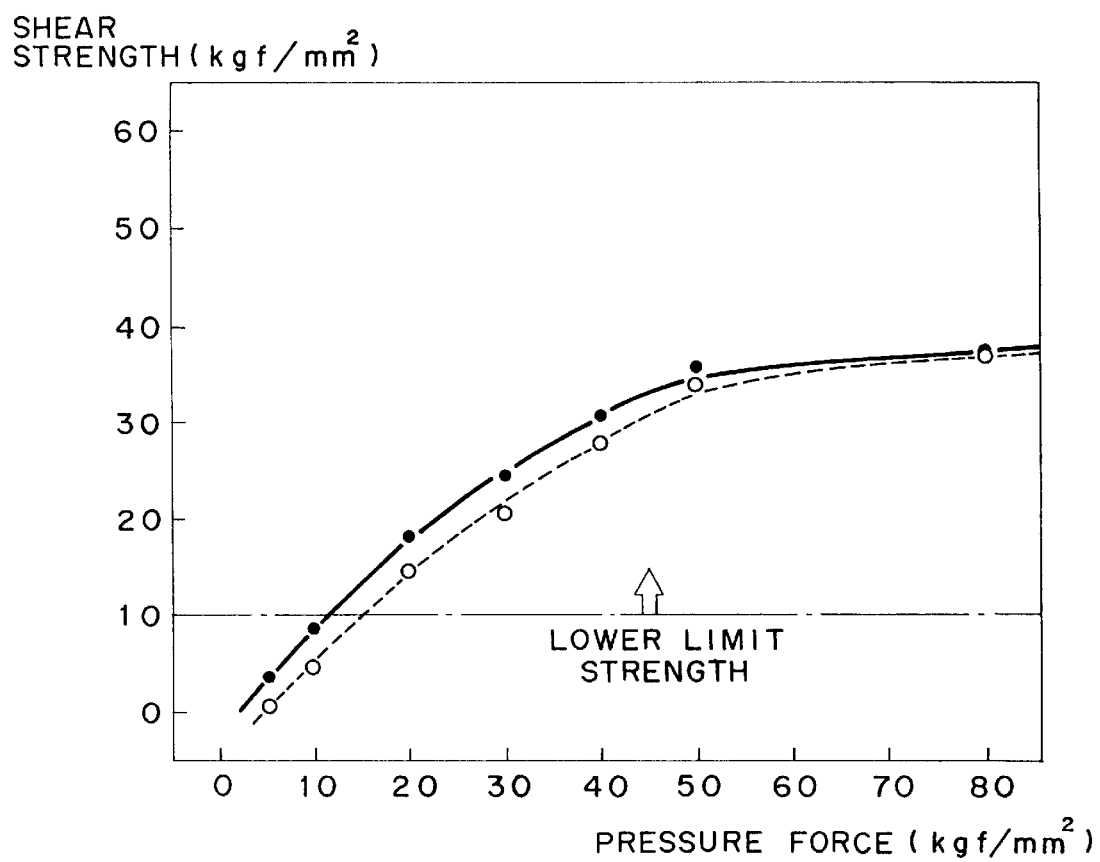
FIG. 16 is a graph showing the comparative results of the shearing strengths after the connections performed by an electrical connecting member according to an embodiment of the present invention and a conventional electrical connecting member.
Figure 17A:
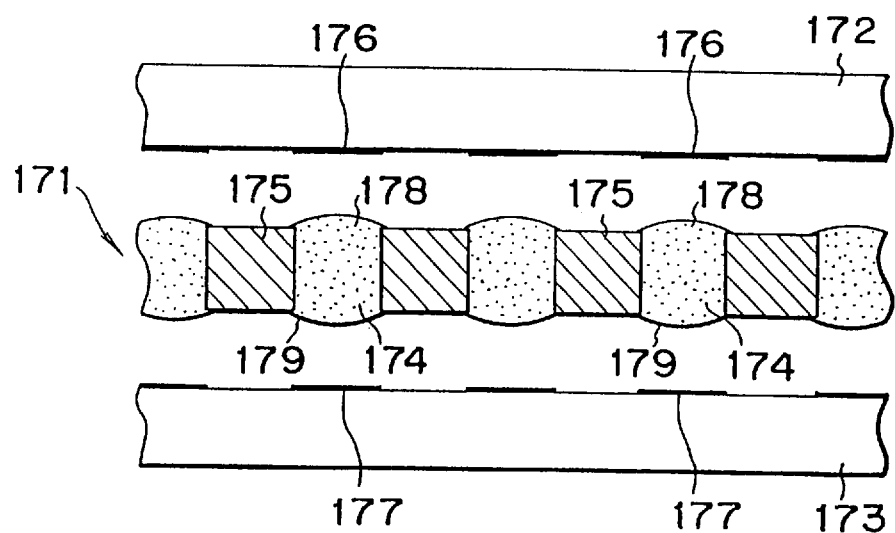
FIG. 17A and FIG. 17B are views schematically illustrating an example of using an electrical connecting member.
Figure 17B:
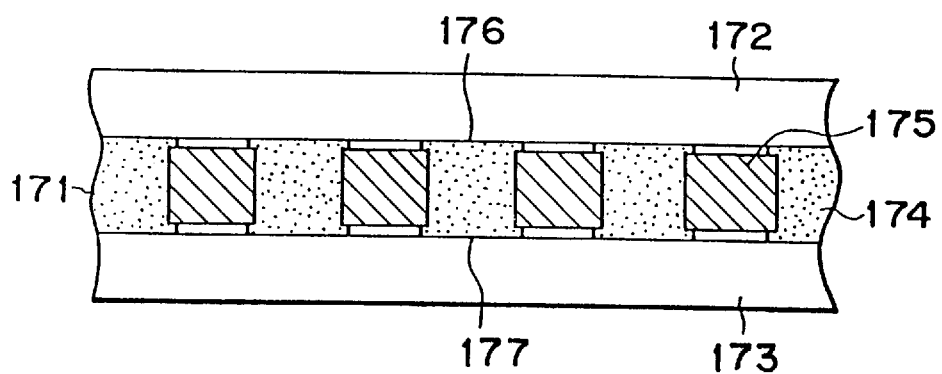
Figure 18A:
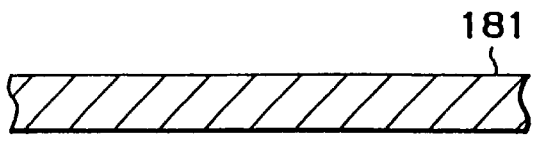
FIG. 18A through 18F are cross-sectional views schematically illustrating the principal manufacturing processes in the related art.
Figure 18B:
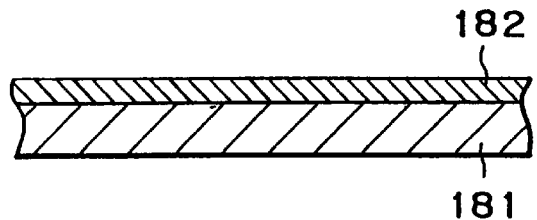
Figure 18C:
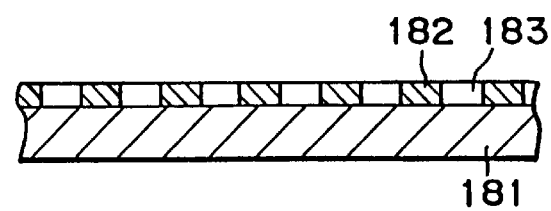
Figure 18D:
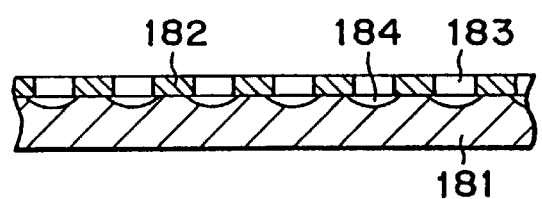
Figure 18E:
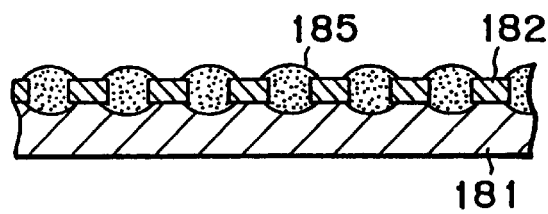
Figure 18F:
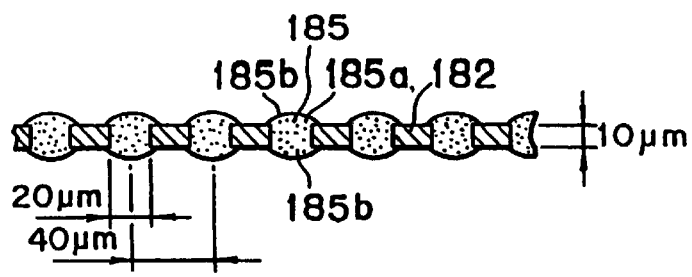
Figure 19:
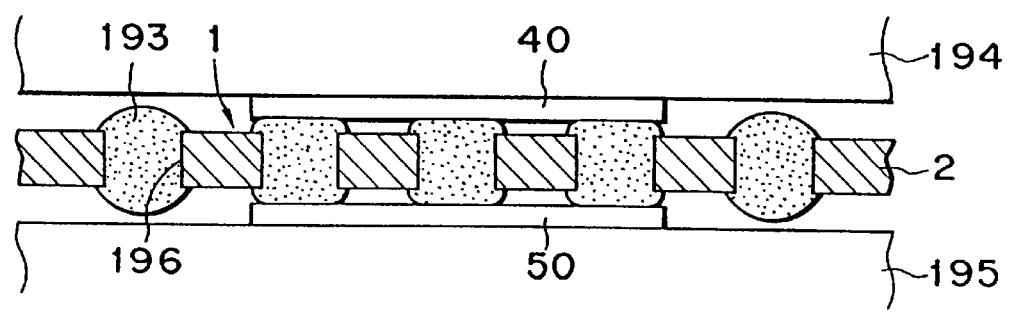
FIG. 19 is a view schematically illustrating a connecting state of electric circuit components with an electrical connecting member.
Figure 20:
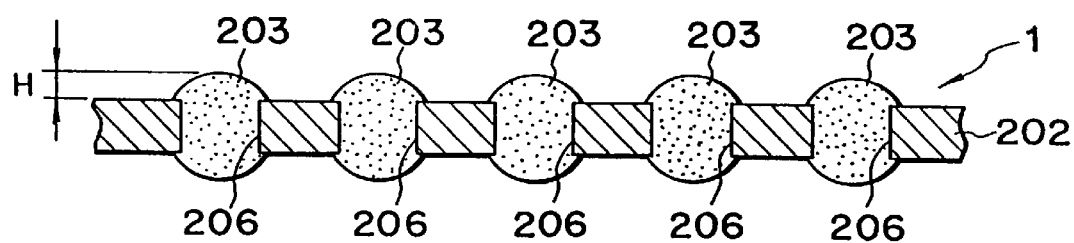
FIG. 20 is a vertically cross-sectional view illustrating a conventional electrical connecting member.

FIG. 15 is a graph showing the results of findings in which, using the electrical connecting member 1 according to the present invention (the product of the present invention) and the elemental product 1' with the conductive members 135 before the annealing treatment. That is, the conventional electrical connecting member (the conventional product), the connections of the electric circuit components 194 and 195 are performed under various pressure forces for the purpose of examining whether a desirable coupling condition is obtained or not for each of many numbers of conductive members 193. Also, FIG. 16 is a graph showing the results of the breaking strength, that is, the shearing strength against the force exerted in the direction rectangular to the pressure force given after having completed the connection. Here, in FIGS. 15 and 16, the results obtained for the products of the present invention are indicated with the mark ● while the results for the conventional products, with the mark ○ respectively.

The axis of abscissa in FIG. 15 indicates the pressure forces exerted for coupling, and the axis of ordinate indicates the rate of the junctions of the conductive members 135, for which desirable coupling conditions have been obtained. As shown in FIG. 15, when the products of the present invention and the conventional products are compared under a same pressure force within a range of small pressure forces, it is clear that a significantly better rate of junctions is obtainable by the products of the present invention. Also, a minimal pressure force required for obtaining almost 100% junction rate for the conventional products is approximately 50 kgf/mm² as indicated by a white blank arrow in FIG. 15, against which it is only 30 kgf/mm² (kilograms of force per square millimeter) or less for the products of the present invention as indicated by a black painted arrow in FIG. 15. As clear from the above results, it is possible to perform reliable coupling under a smaller pressure force when an electrical connecting member 1 according to the present invention is provided with the conductive members 135 which are softened by the annealing treatment. Also, there is less fear that the crackings are created in the conductive members 135 and the holding member 132 with the accompanying pressure, thus making it possible to prevent effectively any increase in electrical resistance and the generation of defective conduction.

Also, the axis of abscissa in FIG. 16 indicates the pressure forces exerted for coupling as in the case of FIG. 15 while the axis of ordinate indicates the shearing forces when breaking takes place in a junction, that is, the shearing strengths. In FIG. 16, when the products of the present invention and the conventional products are compared, it is clear that the shearing strength of the products of the present invention is generally greater than that of the conventional products. The two-dot chain line in FIG. 16 indicates the lower limit strength required for a junction of the kind. When the products of the present invention are used, this lower limit strength is obtainable by applying a pressure force of approximately 10 kgf/mm². However, when the conventional products are used, it is necessary to apply a pressure force of approximately 15 kgf/mm². From this it is apparent that a more desirable connecting condition can be obtained by an electrical connecting member 1 according to the present invention.

In this respect, in the embodiment described above, it may be possible to use a film made of photosensitive resin as the photosensitive resin film. In this case, the hardening process can be omitted. Accordingly, it is possible to eliminate any irregularities due to the changes in the resin characteristics. Also, it may be possible to use an inorganic material such as ceramic or glass instead of the polyimide resin.

Also, in the aforesaid embodiments, the descriptions have been made of the structure in which a copper plate with a tungsten film formed on the surface thereof is used as a substrate 1. There is no particular limitation thereto, and in place of W, there may be employed Mo, Ni, or other high fusion point metal which cannot be alloyed with the conductive member, yet creating no compounds between metals when a heating treatment is given. Also, the substrate 1 itself may be constructed with any one of them if only such a metal is capable of being removed without etching the holding member and conductive members.

Also, as the holding member which is an electric insulator, it may be possible to use, besides the photosensitive resin, a thermo-hardening resin, photosensitive polyimide resin, photosensitive epoxy resin or the film thereof, or other insulating epoxy resin, silicon resin and the films thereof. Also, it may be possible to contain in these resins a kind or plural kinds of inorganic materials, metallic materials, or alloys distributively in a desired type such as particle, fibrous, plate, bar, spherical or other shape. For the metallic materials, alloys to be contained, Au, Ag, Cu, Al, Be, Ca, Mg, Mo, Fe, Ni, Co, Mn, W, Cr, Nb, Zr, Ti, Ta, Zn, Sn, Pb—Sn, and others can be named. For the inorganic materials to be contained, ceramic, diamond, glass, carbon, boron such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_6$, $TiO_2$, MgO, SiC, BeO, BP, BN, AlN, $B_4C$, TaC, $TiB_2$, $CrB_2$, TiN, $Si_3N_4$, $Ta_2O_5$.

Further, gold is used for the conductive members 5, but in place thereof, a simple metallic substance such as Cu, Ag, Be, Ca, Mg, Mo, Ni, W, Fe, Ti, In, Ta, Zn, Al, Sn, Pb—Sn or its alloy of these simple metallic substances may be used. The cross-sectional shape of the conductive member 5 can be circle, square, or other shape, but it is desirable to use a shape which does not have any corners in order to avoid any excessive concentration of stresses.

Now, as set forth above, in an electrical connecting member according to the embodiments of the present invention and in the manufacturing method therefor, the conductive members are made in a state that they are projected for dimensions corresponding to the portions of the holding member which have been transpired by etching or high energy beam from one side or both sides. Thus, it is possible to define the surplusages for the deformation work of the conductive members arbitrarily as well as to enable a low pressure coupling when they are coupled to other electrodes or the like. As a result, it is possible to prevent any excessive forces from being given to the electrodes or the like and also any excessive stresses from being exerted by the holding member onto the conductive members due to thermal distortion and the like. Furthermore, it is possible to make junctions reliably even when there is camber, curve, unevenness or the like in the electrode and others. Hence the present invention displays excellent effects including the provision of the enhanced reliability in its connecting capability.

Also, in the above-mentioned embodiments, the conductive members are in a state that they are apparently projected in a length corresponding to the portion of the thickness of the removed supporting layer from one side or both sides of the holding member, so that the surplusage for the deformation work of the conductive members become greater by that extent, thus enabling the performance of a low pressure coupling when they are coupled to the other electrodes and others. In this way, it is possible to prevent any excessive forces from being given to the electrodes and make junctions reliably even when there is camber, curve, unevenness or the like in the electrode and others. Hence, the present invention displays excellent effects including the provision of the enhanced reliability in its connecting capability.

Also, in the above-mentioned embodiments of an electrical connecting member, it is possible to reduce the coupling load at the time of thermocompression or compression bonding even when there is irregularity in the heights of the bump portions or unevenness in the junctions of the objective connection as well as to prevent the bump portions from being expanded. Accordingly, the present invention can display excellent effects in implementing high density connections between electric circuit components.

In an electrical connecting member according to the embodiments described above in detail, the gold conductive members filled in the through holes in the holding member are softened by an annealing treatment given after the filling, and since they can be deformed easily by the pressure force exerted at the time of connecting the electric circuit components, it is possible to absorb the differences in the exposed heights of the conductive members by the deformation of each of them even when there are a mixture of conductive members having various exposed heights on the surface of the holding member. As a result, the metallic coupling between the conductive members having smaller exposed heights and objective electrodes to be connected can be desirably performed and at the same time, any excessive deformation that may take place when the conductive members having greater exposed heights are coupled is absorbed over the surface of the holding member.

Accordingly, the deformation amounts in the through holes formed in the holding member are small, thus there being less fear that accompanying crackings occur in the holding member and conductive members. In this way, the present invention produces excellent effects among other advantages in preventing efficiently the increase in the electric resistance and defective conduction occurring when the electric circuit components are connected.

What is claimed is:

1. An electrical connecting member disposable between electrical circuit components for electrically connecting the electrical circuit components, said electrical connecting member comprising:

a holding member made of an electric insulating material; and a plurality of conductive members held by said holding member such that each of said conductive members is insulated from each other one of said conductive members, one end of each of said conductive members being exposed on one surface of said holding member and an opposite end of each said conductive members being exposed on another surface of said holding member and each said conductive member having bumps formed on opposite ends thereof, with said bumps being exposed on said holding member and deformable by contact with said elastic circuit components, wherein each said conductive member is provided with empty holes formed only in said bumps, said empty holes being sized for absorbing deformation of said bumps caused by contact with said elastic circuit components, thereby limiting a lateral spread of said conductive member caused by contact with said electrical circuit components.

2. An electrical connecting member according to claim 1, where said bumps on opposite ends of each said conductive member are malleable.

\* \* \* \* \*

UNITED STATES PATENT AND TRADEMARK OFFICE
CERTIFICATE OF CORRECTION

PATENT NO. : 5,860,818

DATED : January 19, 1999

INVENTOR(S) : Sakaki et al.

It is certified that error appears in the above-identified patent and that said Letters Patent is hereby corrected as shown below:

Title page, item

[57] ABSTRACT:

Line 19, "1B," should read --i.e.,--.

COLUMN 2:

Line 45, "to" (first occurrence) should be deleted.

COLUMN 7:

Line 27, "ashing" should read --etching--.
Line 28, "ashing" should read --etching--.

COLUMN 8:

Line 20, "vertically" should read --vertical--.

COLUMN 15:

Line 40, "50 kgf/mm$^2$" should read --50 kgf/mm$^2$ (kilograms of force per square millimeter)--.

UNITED STATES PATENT AND TRADEMARK OFFICE
CERTIFICATE OF CORRECTION

PATENT NO. : 5,860,818

DATED : January 19, 1999

INVENTOR(S) : Sakaki et al.

It is certified that error appears in the above-identified patent and that said Letters Patent is hereby corrected as shown below:

Line 42, "kilograms of force per square millimeter" should be deleted.

COLUMN 18:

Line 22, "members" should read --member--.

Signed and Sealed this

Eighth Day of February, 2000

*Attest:*

Q. TODD DICKINSON

*Attesting Officer*     *Commissioner of Patents and Trademarks*